United States Patent [19]

Ameen et al.

[11] Patent Number: 5,028,984
[45] Date of Patent: Jul. 2, 1991

[54] EPOXY COMPOSITION AND USE THEREOF

[75] Inventors: Joseph G. Ameen, Apalachin; Joseph Funari, Vestal; Bahgat G. Sammakia, Johnson City; David W. Sissenstein, Jr., Endwell; Samuel L. Smey, Binghamton, all of N.Y.

[73] Assignee: International Business Machines Corporation, Armonk, N.Y.

[21] Appl. No.: 267,406

[22] Filed: Nov. 4, 1988

[51] Int. Cl.$^5$ .............................................. H01L 23/28
[52] U.S. Cl. ........................................ 357/72; 357/81; 524/80; 528/110
[58] Field of Search ............... 357/72, 74, 81; 524/80; 528/93, 110

[56] References Cited

U.S. PATENT DOCUMENTS

| | | | |
|---|---|---|---|
| 3,492,535 | 1/1970 | Behrendt | 317/100 |
| 3,527,720 | 9/1970 | Groff | 260/18 |
| 3,641,195 | 2/1972 | Ball et al. | 260/837 |
| 3,763,087 | 10/1973 | Holub et al. | 260/41 |
| 3,801,427 | 4/1974 | Morishita et al. | 161/162 |
| 3,898,422 | 8/1975 | Fuller et al. | 219/201 |
| 3,908,040 | 9/1975 | Dauksys | 427/58 |
| 3,928,668 | 12/1975 | Snow | 427/14 |
| 3,972,821 | 8/1976 | Weidenbenner et al. | 252/75 |
| 4,018,944 | 4/1977 | Hallstrom | 427/140 |
| 4,092,487 | 5/1978 | Imai | 357/72 |
| 4,092,697 | 5/1978 | Spaight | 361/386 |
| 4,145,327 | 3/1979 | Dolch et al. | 260/29.6 |
| 4,159,221 | 6/1979 | Schuessler | 156/285 |
| 4,175,152 | 11/1979 | Carnahan et al. | 428/242 |
| 4,233,620 | 11/1980 | Darrow et al. | 357/74 |
| 4,233,645 | 11/1980 | Balderes et al. | 361/385 |
| 4,265,775 | 5/1981 | Aakalu et al. | 252/573 |
| 4,268,337 | 5/1981 | Ibata et al. | 156/244 |
| 4,371,579 | 2/1983 | McCaskey et al. | 428/204 |
| 4,372,347 | 2/1983 | Olson | 139/420 |
| 4,410,647 | 10/1983 | Susko et al. | 525/493 |
| 4,546,410 | 10/1985 | Kaufman | 361/387 |
| 4,555,533 | 11/1985 | Ambros et al. | 524/413 |
| 4,574,879 | 3/1986 | DeGree et al. | 165/185 |
| 4,581,158 | 4/1986 | Lin | 252/511 |
| 4,593,052 | 6/1986 | Irving | 522/31 |
| 4,596,840 | 6/1986 | Hesse et al. | 523/400 |
| 4,601,916 | 7/1986 | Arachtingi | 427/97 |
| 4,642,321 | 2/1987 | Schoenberg et al. | 523/400 |
| 4,647,402 | 3/1987 | Tamura | 252/511 |
| 4,661,304 | 4/1987 | Okada et al. | 264/41 |
| 4,678,831 | 7/1987 | Kawabata et al. | 524/496 |
| 4,685,987 | 8/1987 | Fick | 156/247 |
| 4,689,110 | 8/1987 | Leibowitz | 156/634 |
| 4,725,650 | 2/1988 | Landi et al. | 525/524 |
| 4,740,425 | 4/1988 | Leland et al. | 428/447 |
| 4,849,856 | 7/1989 | Funari et al. | 357/81 |

FOREIGN PATENT DOCUMENTS

| | | |
|---|---|---|
| 3711238 | 10/1987 | Fed. Rep. of Germany . |
| 50-76562 | 6/1975 | Japan . |
| 55-109623 | 8/1980 | Japan . |
| 60-190344 | 9/1985 | Japan . |
| 60-190345 | 9/1985 | Japan . |
| 60-190346 | 9/1985 | Japan . |

OTHER PUBLICATIONS

Yeh, "Bump Internal-Thermal Enchancement", IBM Technical Disclosure Bulletin, vol. 27, No. 7B, Dec. 1984, pp. 4413–4415.

Buller et al., "Module Process Compatible Thermally Enhanced Fin Attach Process", IBM Technical Disclosure Bulletin, vol. 24, No. 1B, Jun. 1981, p. 863.

Irish et al., "Enhanced Adhesion and Thermal Conductivity of Epoxy Sealant", IBM Technical Disclosure Bulletin, vol. 28, No. 11, Apr. 1986, p. 4710.

Electronics Products Magazine, Jul. 1968, Epoxies for Packaging.

(List continued on next page.)

Primary Examiner—Andrew J. James
Assistant Examiner—Courtney A. Bowers
Attorney, Agent, or Firm—Pollock, Vande Sande & Priddy

[57] ABSTRACT

A curable composition containing an epoxide component and zinc oxide and use thereof.

23 Claims, 1 Drawing Sheet

OTHER PUBLICATIONS

Doo et al., "Method of Effective Cooling of a High Power Silicon Chip", IBM Technical Disclosure Bulletin, vol. 20, No. 4, Sep. 1977, pp. 1436 and 1437.

Materials Selector, Mid-Sep. 1973, pp. 17 et seq.

"Handbook of Fillers for Plastics", Katz et al., Van Nostrand Reinhold Company, 1987, Section 2.2.7 and Table 12-1.

"Technology of Paints, Varnishes and Lacquers", pp. 354-355.

"Zinc Oxide Properties and Applications", International Lead Zinc Research Organization, New York, Chapter 5, p. 3.

Tuckerman, "Heat-Transfer Microstructures for Integrated Circuits", Lawrence Livermore National Laboratory, University of California, Feb. 1984.

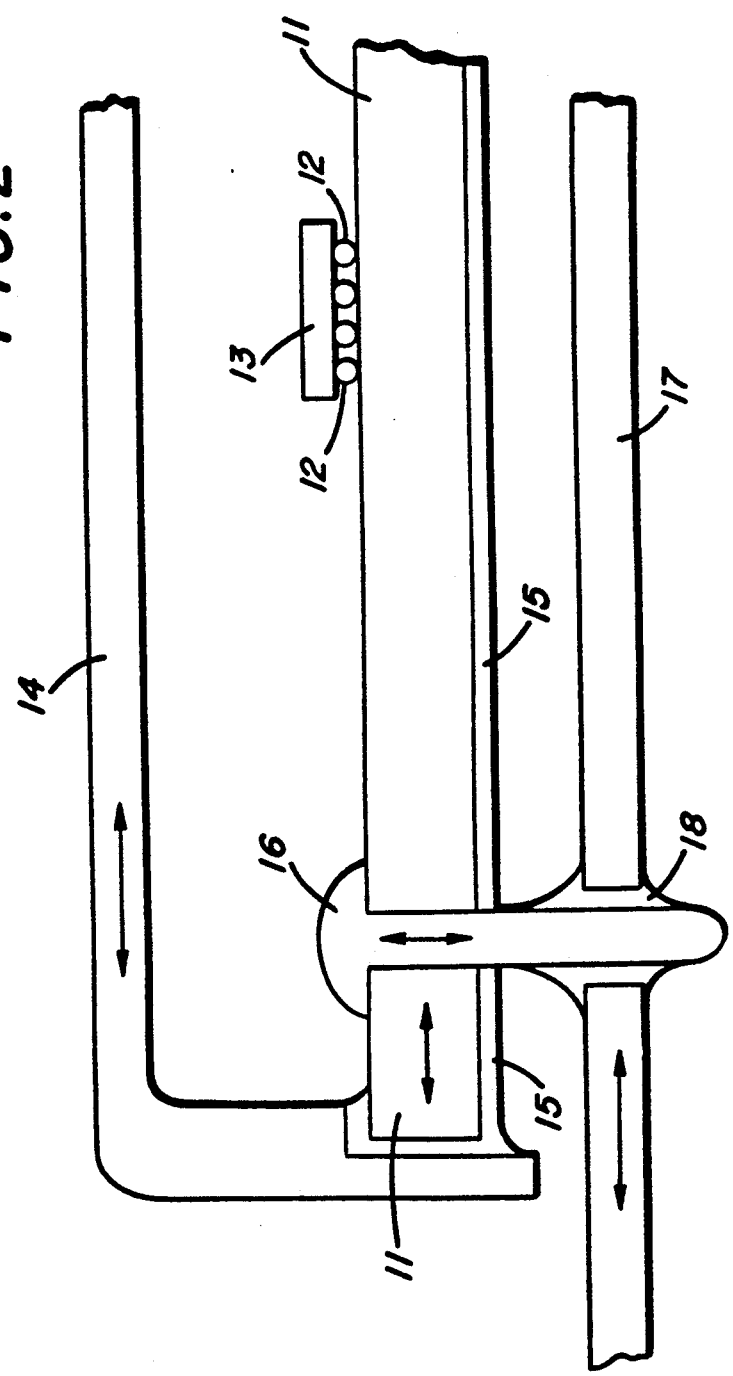
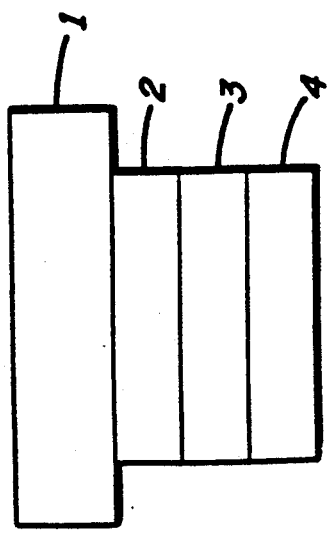
FIG.1
FIG.2

EPOXY COMPOSITION AND USE THEREOF

DESCRIPTION

1. Technical Field

The present invention is concerned with a curable epoxide composition The epoxide compositions of the present invention are especially useful as adhesives for bonding integrated circuit chips to a heat sink and as backseal for integrated circuit chip modules. The epoxide compositions of the present invention exhibit relatively high thermal conductivity and are relatively fast curing.

2. Background Art

During use, various electrical components generate heat, and for proper functioning it is necessary to remove the heat.

Various methods have been suggested to accomplish this heat transfer away from the electrical components, such as integrated circuit modules. Such modules usually include a cap to protect the integrated circuit chip from the atmosphere.

A number of thermal greases have been suggested for application between the integrated circuit chip and the cap as a means for conducting heat from the chip to the module cap whereafter it is dissipated into the ambient surroundings.

Examples of such greases can be found in U.S. Pat. No. 4,265,775 to Aakalu, et al.; U.S. Pat. No. 4,092,697 to Spaight; and IBM Technical Disclosure Bulletin, Vol. 20, No. 4, September 1977, Doo, et al., "Method of Effective Coating of a High Power Silicon Chip".

Use of greases is not entirely satisfactory since, for instance, problems in applying and handling such have been experienced. For instance, see U.S. Pat. No. 4,546,410 to Kaufman.

In addition, with respect to those configurations that employ flexible films such as polyimides as the carrier, it is necessary that the interface with the heat sink be relatively rigid and structural. In particular, greases can be deformed which would allow the chip to heat sink gap to vary which could result in loss of contact with the heat sink altogether.

Furthermore, the adhesive must withstand cleaning cycles in a degreaser which eliminates most greases from consideration.

In order to be satisfactory for such purposes, the adhesive must satisfy a number of criteria. For instance, the composition must have high thermal conductivity, low electrical conductivity, and chemical compatibility, in addition to the usual chemical and mechanical properties expected from an adhesive. The composition should resist deterioration when subjected to mechanical stresses. Such should also have good flexibility and be able to withstand thermal cycling (i.e., expansion and contraction due to temperature changes) without cracking.

Some epoxy compositions possess certain, but not all, of the above properties and have been used as encapsulants or sealants. One such composition contains about 47.6% by weight of a bisphenol A-epichlorohydrin epoxy polymer, about 52% by weight of a hardener and flexibilizer mixture, and about 0.4% by weight of a coloring agent. The hardener and flexibilizer mixture contains about 25% to 39% of hexahydrophthalic anhydride, about 50% to about 75% by weight of a polypropylene glycol and/or polyoxypropylene glycol flexibilizer, about 0.85% to about 1% by weight of a tertiary amine (e.g., trimethyl amine), and a minor amount of hexahydrophthalic acid resulting from hydrolysis of the corresponding anhydride. The coloring agent employed is generally a mixture of chlorinated copper phthalocyanine on a titanium dioxide pigment.

In addition, U.S. Pat. No. 4,233,620 to Darrow, et al. discloses improving various properties of such composition such as flexibility, disclosure of which is incorporated herein by reference.

The above epoxy compositions are not especially thermally conductive and, therefore, not useful for the purposes of the present invention. Also, these epoxy compositions are relatively slow to cure.

SUMMARY OF THE INVENTION

The present invention provides an adhesive that can be used in place of the thermal grease compositions and will bond integrated circuit chips to a heat sink. In addition, the adhesive of the present invention provides an excellent backseal for integrated circuit modules.

The present invention provides for a significant increase in the thermal conductivity of epoxy compositions without a noticeable deterioration in those properties of the composition that are essential for providing adhesive bonding from integrated circuit modules to a heat sink and as a backseal for integrated circuit modules.

In addition, the present invention provides a curable epoxy composition that is curable by at least a magnitude faster than the corresponding epoxy compositions that do not contain the modifications required by the present invention.

The compositions of the present invention can withstand thermocycling (0°–100° C.) without cracking. Moreover, the composition of the present invention withstands the temperature and humidity testing (85° C./80% relative humidity) and thermal aging (130° C.).

In particular, the present invention is concerned with a curable epoxy composition which contains an epoxy component and zinc oxide. The epoxy component includes an epoxy polymer and a hardening component. The relative weight amount of the zinc oxide to the epoxide component must be about 1:4 to about 2:1 in order to achieve the improved properties obtained by the present invention.

Furthermore, the present invention is concerned with an integrated circuit module that contains a flexible substrate and having attached to one major surface of the substrate at least one integrated circuit chip. The integrated circuit chip is bonded to a heat sink with the above epoxy composition in its cured form.

The present invention is also concerned with integrated circuit modules containing as the backseal the above epoxy composition in its cured form.

SUMMARY OF THE DRAWINGS

FIG. 1 is a schematic cross-section of a module in accordance with the present invention.

FIG. 2 is a schematic cross-section of a module employing the epoxy composition of the present invention as a backseal.

BEST AND VARIOUS MODES FOR CARRYING OUT THE INVENTION

The curable epoxy compositions of the present invention contain zinc oxide and an epoxy component. The zinc oxide powder employed in the present invention can be present in any of the various particle shapes available with the preferred shape being spherical. Most of the ZnO commercially available in the United States is, in fact, spherical.

In addition, the particle size of the zinc oxide can vary over a wide range. The preferred zinc oxide particles have a particle size that is predominantly at least about 70% within the range of 1-4 microns and over 90% being within the range of 1-10 microns.

The following Table is a zinc oxide particle size distribution reported for typical zinc oxide lots:

| | Particle Counts on Different ZnO Lots ZnO PARTICLE SIZE DISTRIBUTION (PERCENT/CHANNEL) | | | | |
|---|---|---|---|---|---|
| Lot | 1-4u | 5-10u | 10-15u | 15-20u | 20-25u |
| A | 82.12 | 17.42 | 0.42 | 0.01 | 0.01 |
| B | 76.79 | 21.85 | 1.31 | 0.03 | 0.01 |
| C | 73.58 | 23.81 | 2.20 | 0.28 | 0.07 |
| D | 82.89 | 16.25 | 0.73 | 0.06 | 0.05 |
| E | 78.44 | 20.19 | 1.23 | 0.07 | 0.02 |
| F | 73.6 | 24.03 | 2.20 | 0.11 | 0.04 |

In order to achieve the enhanced curing rate and necessary thermal conductivity without adversely affecting the other properties of the adhesive, it is necessary that the relative weight ratio of the zinc oxide to the epoxy component be about 1:4 to about 2:1.

In the preferred aspects of the present invention, the zinc oxide is present in an amount of about 50% to about 70% by weight of the total of the zinc oxide and epoxy component. This is especially important for compositions that are desired to be applied by screen printing.

With respect to the epoxide component of the compositions, such must contain an epoxy polymer and a hardener portion. The epoxy polymer employed according to the present invention is diglycidyl ethers of bisphenol A-epichlorohydrin. The epoxy component can also contain minor amounts (e.g., up to about 5% by weight) of other types of epoxides such as phenyl glycidyl ether.

The epoxy polymers generally have an epoxy equivalent weight of about 180 to about 210 and desirably have a viscosity of about 6,500 centipoise to about 22,500 centipoise at 25° C.

Some examples of epoxy polymers that are commercially available from Shell Oil include Epon 820, Epon 826, Epon 830, and Epon 828.

Epon 828 is a diglycidyl ether of bisphenol A-epichlorohydrin having an epoxy equivalent weight of 185 to 192 and a viscosity of 10,000 centipoise to 15,000 centipoise at 25° C.

Epon 829 is a mixture of Epon 828 with about 2% to about 5% by weight of phenyl glycidyl ether and has an epoxy equivalent weight of 180 to 195 and a viscosity of 6,500 centipoise to 10,000 centipoise at 25° C.

Epon 826 is a diglycidyl ether of bisphenol A-epichlorohydrin having an epoxy equivalent weight of 180 to 188 and a viscosity of 6,500 centipoise to 9,500 centipoise at 25° C.

Epon 830 is a diglycidyl ether of bisphenol A-epichlorohydrin having an epoxy equivalent weight of 190 to 210 and a viscosity of 15,000 centipoise to 22,000 centipoise at 25° C.

The hardener is typically an anhydride such as nadic methyl anhydride and preferably a phthalic type anhydride such as hexahydrophthalic anhydride and tetrahydrophthalic anhydride. Mixtures of anhydrides including minor amounts of other anhydrides including aliphatic anhydrides such as maleic anhydride with the phthalic type anhydrides can be employed, if desired.

The epoxide component can also, and preferably does, include a flexibilizer.

The flexibilizer is a polyalkylene glycol or polyoxyalkylene glycol which can be represented by the formula:

$$HO-R-O-[-R-O]_n-R-OH$$

wherein R is a divalent saturated aliphatic hydrocarbon moiety selected from the group of ethylene, propylene, butylene, and mixtures thereof. These groups can be straight or branched chained.

Mixtures of these glycols can be employed if desired. The n is 0 or an integer such that the molecular weight thereof in conjunction with the amount used is such that the viscosity of the hardener and flexibilizer portion is about 900 to about 2,500 centipoise at 25° C.

Examples of some suitable glycols include polyethylene glycol, polypropylene glycol, polyoxyethyleneoxypropylene glycol, and polybutylene glycol. The preferred glycols are polypropylene glycol and polyoxypropylene glycol.

The epoxide component can, and also preferably, contains a tertiary amine cure accelerator. The tertiary amines include the saturated aliphatic monoamines such as trimethylamine and triethylamine.

In addition, minor quantities of acid(s), e.g., up to about 1% based upon the epoxide component, might be present due to hydrolysis of the corresponding anhydride(s).

If desired, the compositions can also include a coloring agent. Typical coloring agents include the phthalocyanine dyes and most preferably are mixtures of chlorinated copper phthalocyanine (a green dye) and titanium dioxide pigment. Such is commercially available in the form of a mixture with a bisphenol A-epichlorohydrin epoxy polymer of the type employed in the present invention under the trade designation Hysol. The commercially available Hysol compositions contain about 20% by weight of the chlorinated or polychloro copper phthalocyanine and titanium dioxide mixture and about 80% by weight of the bisphenol A-epichlorohydrin epoxy resin (Shell Epon 828). Mixtures of coloring agents can be employed if desired.

However, it is preferred not to include a coloring agent, and in such case a white, opaque composition is obtained.

By including the above ingredients in the epoxide component portion, it is not intended to mean that these must be premixed together separately prior to admixing with the zinc oxide. These components have been recited in this manner so as to facilitate the calculations and disclosure with respect to the relative amounts of ingredients employed.

The epoxide component typically contains about 75% to about 85% by weight of the epoxy and correspondingly, about 15% to about 25% by weight of the hardener based upon the total weight of epoxy and hardener.

With respect to those compositions that include the flexibilizer and other ingredients, the epoxide component contains the following relative amounts: about 45% to about 65% by weight of the epoxy; about 34% to about 54% by weight of the combination of the hardener and flexibilizer portion; and 0% to about 0.6% and, if present, usually preferably about 0.4% to about 0.6% of the coloring agent.

The hardener and flexibilizer portions generally contain about 15% to about 49% by weight and preferably about 25% to about 49% by weight of the anhydride; about 40% to about 85% by weight and preferably about 50% to about 75% by weight of the polyalkylene glycol and/or polyoxyalkylene glycol flexibilizer; up to about 1% and preferably about 0.85% to about 1% by weight of a tertiary amine; and minor amounts of an acid resulting from the hydrolysis of the corresponding anhydride hardener.

A preferred epoxide component contains about 47.6% by weight of a bisphenol A-epichlorohydrin epoxy polymer; and about 52% by weight of a hardener and flexibilizer mixture.

The hardener and flexibilizer mixture contains about 25% to 49% of hexahydrophthalic anhydride; about 50% to about 75% by weight of a polypropylene glycol and/or polyoxypropylene glycol flexibilizer; about 0.85% to about 1% by weight of a tertiary amine (e.g., trimethyl amine); and a minor amount of hexahydrophthalic acid resulting from hydrolysis of the corresponding anhydride.

The coloring agent, if employed, is generally a mixture of chlorinated copper phthalocyanine on a titanium dioxide pigment.

The epoxy compositions of the present invention are especially useful both as (1) the thermal adhesive to bond integrated circuit chip(s) to a heat sink and (2) as the backseal for integrated circuit chip modules.

With respect to the use as a backseal for integrated circuit chip modules, a typical arrangement includes an integrated chip carrier such as a ceramic substrate sealed by the epoxy composition of the present invention to a protective cap such as an aluminum cap.

Typical substrates include ceramics such as silicon oxides, aluminum oxides, and silicates, for example, aluminum silicate.

The adhesives of the present invention provide an excellent bond between the dissimilar materials employed as the cap and the substrate.

Preferred flexible substrates upon which the integrated circuit chip(s) can be mounted are the polyimides. The polyimides include unmodified polyimides, as well as modified polyimides such as polyester imides, polyamide-imide-esters, polyamide-imides, polysiloxane-imides, as well as other mixed polyimides. Such are well-known in the prior art and need not be described in any great detail.

Generally, the polyimides include the following recurring unit:

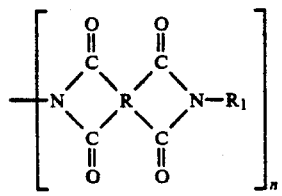

where n is an integer representing the number of repeating units to provide a molecular weight usually about 10,000 to about 100,000. R is at least one tetravalent organic radical selected from the group consisting of:

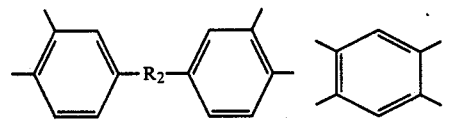

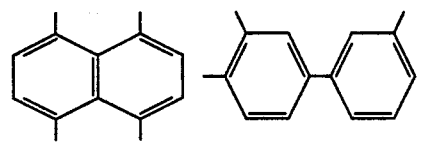

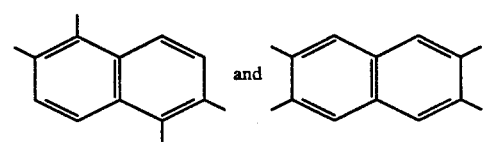

$R_2$ being selected from the group consisting of divalent aliphatic hydrocarbon radicals having from 1 to 4 carbon atoms and carbonyl, oxy, sulfo, hexafluoroisopropylidene divalent radical selected from the group consisting of:

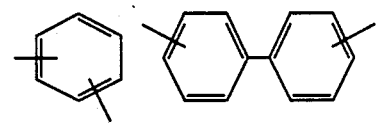

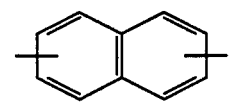

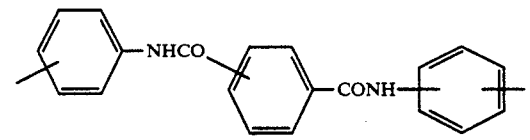

and

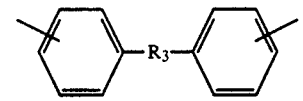

in which $R_3$ is a divalent organic radical selected from the group consisting of $R_2$, silico, and amino radicals. Polymers containing two or more of the R and/or $R_1$ radicals, especially multiple series of $R_1$ containing amido radicals, can be used.

Commercially available polyimide precursors (polyamic acid) that can be cured by heating to polyimides include various polyimide precursors from DuPont, available under the trade designation Pyralin. This polyimide precursor comes in many grades, including those available Pyralin polyimide precursors from DuPont under the further trade designations: PI-2555, PI-2545, PI-2560, PI-5878, PIH-61454, and PI-2540. A number of these are Pyromelletic Dianhydride-Oxydianiline (PMDA-ODA) polyimide precursors.

Commercially available chemically cured polyimides are various polyimides from DuPont and available under the trade designation Kapton, including H-Kapton, V-Kapton, HN-Kapton, and VN-Kapton, which are all chemically cured polyimides. The chemically cured polyimides are generally cured with acetic anhydride and pyridine.

The chips can be mounted, for instance, on polyimides by thermal compression bonding which employs a gold or tin coating on the two surfaces to be bonded. In the case with gold, about 80 grams pressure per contact pad at about 550° C. causes the two gold layers to fuse together, forming a strong bond. The tin-to-tin or tin-to-gold bond is along the lines of typical soldering.

FIG. 1 illustrates a structure employing the composition of the present invention.

Number 1 represents the substrate upon which the chip(s) (2) such as a silicon or polycrystalline silicon chip (2) is mounted. Number 3 represents a layer of the cured composition of the present invention, and number 4 represents a heat sink such as an aluminum film. Examples of other heat sinks are anodized aluminum, copper, nickel plated, or bright tin plated, or BTA (benzotriazole) treated, or copper/Invar/copper. Invar is a trademark of International Nickel for a nickel-chromium stainless steel. The structure can then be sealed within a cap or can (not shown) as known in the art to preclude or at least substantially eliminate contact with atmospheric contaminants.

If desired, the epoxy compositions of the present invention can also be used to seal the module within a cap or can.

Reference to FIG. 2 illustrates a typical arrangement employing the epoxy composition of the present invention as a seal between a substrate and cap or can. In particular, numeral (11) represents a substrate such as a rigid ceramic substrate having bonded thereto integrated circuit chip(s) (13) by solder joints (12). The cap (14), such as an aluminum cap, protects the chip(s) (13) from exposure to the surrounding atmosphere. The substrate (11) and cap (14) are sealed together by the adhesive or sealant (15) of the present invention. The substrate (11) includes through-holes that provide for Input/Output pins (16). The Input/Output pins (16) connect the module to a circuit card or circuit board (17). The pins (16) can be secured to the card or board (17) by conventional solder joint (18).

The compositions of the present invention can be applied by various conventional coating techniques including screen printing.

After the coating step the composition is cured by the application of elevated temperatures. The compositions are generally cured at temperatures of about 100° C. to about 200° C. for less than 1 minute to about 45 minutes.

In a typical example the adhesive composition is screened through a template contained in a semiautomatic tool onto a metal heat sink (e.g., bright tin-plated copper). The heat sink is then aligned over the chip and a predetermined force (typically, about 8 pounds) is applied to the top of the heat sink so that it deforms the heat sink, causing the adhesive to be pressed against the chip of the circuit. The force is removed and the parts baked (e.g., about 15 minutes at about 120° C.).

The following non-limiting examples are presented to further illustrate the present invention.

EXAMPLE 1

Onto a bright tin-plated copper heat sink is dispensed by screen printing a composition containing about 100 parts by weight of Scotchcast XR-3259 from 3M Company as the epoxy component; and about 100 parts by weight of zinc oxide.

The coating thickness is about 3 mils. The composition and the substrate are at room temperature during dispensing. The temperature of the coating is raised to 100° C. and cures in about 30 minutes at that temperature. The composition of this example cures at 120° C. in less than 14 minutes. These curing times are much shorter than those experienced at the same temperatures with the Scotchcast epoxy composition without the zinc oxide.

The following formula governing effective thermal conductivity is:

$$K_{eff} = 4 K_{carrier} (\ln K_{solid}/K_{carrier})$$

wherein:
$K_{eff}$ = thermal conductivity of the composition
$K_{carrier}$ = thermal conductivity of the epoxy component of the composition.
$K_{solid}$ = thermal conductivity of the ZnO.
Since $K_{carrier}$ is 0.4 watts/meter°C., a 50% content of ZnO results in a fivefold increase $4 \times .4 \times \ln (9.9/.4)$ as compared to no ZnO being present.

EXAMPLE 2

Example 1 is repeated, except that the composition contains about 65% by weight of zinc oxide and about 35% by weight of the epoxy component.

The composition cures at about 100° C. in about 37 minutes, at 120° C. in about 15 minutes, and at 150° C. in about 5 minutes.

COMPARISON EXAMPLE 3

Example 1 is repeated, except that no zinc oxide is employed. The temperatures require about 1,523 minutes to cure at 100° C. and 145 minutes at 120° C. A comparison of Examples 1 and 2 with Comparison Example 3 illustrates the significantly enhanced curing rate achieved by the present invention.

EXAMPLE 4

A ceramic substrate having printed circuit lines of copper/chromium/copper along with silicon chip on one surface thereof and pins through the ceramic is capped with an aluminum cap covering the surface containing the circuit lines and chip. The module is placed aluminum cap side down on a hot plate heated to about 100° C. and placed beneath a dispensing nozzle head. The composition employed in Example 1 is dispensed by liquid dispensing through the nozzle head at a temperature of about 60° C. and permitted to cure in order to seal the cap to the ceramic substrate. To assure complete cure, the composition is subjected to temperatures of about 120° C. for about ½ hour.

What we claim as new and desire to secure by Letters Patent is:

1. A curable composition containing:
   a) an epoxide component that includes an epoxy polymer and hardening component; and
   b) zinc oxide;

wherein the amount of said zinc oxide is about 50% to about 70% by weight of the total of the zinc oxide and epoxide component; and wherein said epoxide component contains about 45% to about 65% by weight of the epoxy; about 35% to about 54% by weight of a combination of hardener and flexibilizer portion wherein said portion contains about 15% to about 49% by weight of anhydride and about 40% to about 85% by weight of polyalkylene glycol or polyoxyalkylene glycol, and about 0.85% to about 1% by weight of a tertiary amine.

2. The composition of claim 1 wherein said epoxy polymer is a diglycidyl ether of bisphenol A-epichlorohydrin.

3. The composition of claim 1 wherein said anhydride is nadic methyl anhydride or a phthalic anhydride.

4. The composition of claim 1 wherein said anhydride is hexahydrophthalic anhydride or tetrahydrophthalic anhydride.

5. An integrated circuit module containing a flexible substrate and having attached to one major surface thereof at least one integrated circuit chip wherein said at least one integrated circuit chip is connected to a heat sink by a cured composition from:
   a) an epoxide component that includes an epoxy polymer and hardening agent; and
   b) zinc oxide;
wherein the amount of said zinc oxide is about 50% to about 70% by weight of the total of the zinc oxide and epoxide component; and wherein said epoxide component contains about 45% to about 65% by weight of the epoxy; about 34% to about 54% by weight of a combination of hardener and flexibilizer portion wherein said portion contains about 15% to about 49% by weight of anhydride and about 40% to about 85% by weight of polyalkylene glycol or polyoxyalkylene glycol and about 0.85% to about 1% by weight of a tertiary amine.

6. The module of claim 5 wherein said substrate is a polyimide.

7. The module of claim 5 wherein said heat sink is selected from the group consisting of aluminum, anodized aluminum, nickel plated copper, bright tin plated copper, benzotriazole treated copper, and copper/Invar/copper.

8. The module of claim 5 wherein said heat sink is aluminum.

9. The module of claim 5 wherein said epoxy polymer is a diglycidyl ether of bisphenol A-epichlorohydrin and said hardener in an anhydride.

10. An integrated circuit module which comprises an integrated circuit carrier having a/an integrated circuit chip(s) bonded thereto, a cap covering said integrated circuit chip(s) for protection against exposure to the surrounding atmosphere, and wherein said carrier is bonded to said cap by a curved composition from:
    a) an epoxide component that includes an epoxy polymer and hardening agent; and
    b) zinc oxide;
wherein the amount of said zinc oxide is about 50% to about 70% by weight of the total of the zinc oxide and epoxide component; and wherein said epoxide component contains about 45% to about 65% by weight of epoxy; about 34% to about 54% by weight of a combination of hardener and flexibilizer portion wherein said portion contains about 15% to about 49% by weight of anhydride and about 40% to about 85% by weight of polyalkylene glycol or polyoxyalkylene glycol and about 0.85% to about 1% by weight of a tertiary amine.

11. The module of claim 10 wherein said carrier is a ceramic substrate.

12. The module of claim 10 wherein said cap is aluminum.

13. The module of claim 10 wherein said epoxy polymer is a diglycidyl ether of bisphenol A-epichlorohydrin and said hardener in an anhydride.

14. The module of claim 5 wherein said anhydride anhydride is nadic methyl anhydride or a phthalic anhydride.

15. The module of claim 5 wherein said anhydride is hexahydrophthalic anhydride or tetrahydrophthalic anhydride.

16. The module of claim 10 wherein said anhydride is nadic methyl anhydride or a phthalic anhydride.

17. The module of claim 10 wherein said anhydride is hexahydrophthalic anhydride or tetrahydrophthalic anhydride.

18. The composition of claim 1 wherein said zinc oxide is spherical having a particle size wherein at least about 70% of the particles are 1-4 microns and over 90% are 1-10 microns.

19. The module of claim 5 wherein said zinc oxide is spherical having a particle size wherein at least about 70% of the particles are 1-4 microns and over 90% are 1-10 microns.

20. The module of claim 10 wherein said zinc oxide is spherical having a particle size wherein at least about 70% of the particles are 1-4 microns and over 90% are 1-10 microns.

21. A curable composition containing:
    a) an epoxide component that includes an epoxy polymer and hardening component; and
    b) zinc oxide wherein said zinc oxide is spherical having a particle size wherein at least about 70% of the particles are 1-4 microns and over 90% are 1-10 microns;
wherein the relative amount of said zinc oxide to said epoxide component is about 1:4 to about 2:1;
and wherein said epoxide component contains about 45% to about 65% by weight of the epoxy; about 35% to about 54% by weight of a combination of hardener and flexibilizer portion wherein said portion contains about 15% to about 49% by weight of anhydride and about 40% to about 85% by weight of polyalkylene glycol or polyoxyalkylene glycol, and about 0.85% to about 1% by weight of a tertiary amine.

22. An integrated circuit module containing a flexible substrate and having attached to one major surface thereof at least one integrated circuit chip wherein said at least one integrated circuit chip is connected to a heat sink by a cured composition from:
    a) an epoxide component that includes an epoxy polymer and hardening agent; and
    b) zinc oxide wherein said zinc oxide is spherical having a particle size wherein at least about 70% of the particles are 1-4 microns and over 90% are 1-10 microns;
wherein the relative amount of said zinc oxide to said epoxide component is about 1:4 to about 2:1;
and wherein said epoxide component contains about 45% to about 65% by weight of the epoxy; about 34% to about 54% by weight of a combination of hardener and flexibilizer portion wherein said portion contains about 15% to about 49% by weight of anhydride and about 40% to about 85% by weight of polyalkylene glycol or polyoxyalkylene glycol and about 0.85% to about 1% by weight of a tertiary amine.

23. An integrated circuit module which comprises an integrated circuit carrier having a/an integrated circuit chip(s) bonded thereto, a cap covering said integrated circuit chip(s) for protection against exposure to the surrounding atmosphere, and wherein said carrier is bonded to said cap by a cured composition from:

a) an epoxide component that includes an epoxy polymer and hardening agent; and b) zinc oxide wherein said zinc oxide is spherical having a particle size wherein at least about 70% of the particles are 1-4 microns and over 90% are 1-10 microns;

wherein the relative amount of said zinc oxide to said epoxide component is about 1:4 to about 2:1; and wherein said epoxide component contains about 45% to about 65% by weight of the epoxy; about 34% to about 54% by weight of a combination of hardener and flexibilizer portion wherein said portion contains about 15% to about 49% by weight of anhydride and about 40% to about 85% by weight of polyalkylene glycol or polyoxyalkylene glycol and about 0.85% to about 1% by weight of a tertiary amine.

* * * * *